United States Patent
Figueroa et al.

(10) Patent No.: US 6,346,743 B1
(45) Date of Patent: Feb. 12, 2002

(54) EMBEDDED CAPACITOR ASSEMBLY IN A PACKAGE

(75) Inventors: David G. Figueroa, Mesa; Yuan-Liang Li; Chee-Yee Chung, both of Chandler, all of AZ (US)

(73) Assignee: Intel Corp., Santa Clara, CA (US)

( * ) Notice: Subject to any disclaimer, the term of this patent is extended or adjusted under 35 U.S.C. 154(b) by 0 days.

(21) Appl. No.: 09/606,531

(22) Filed: Jun. 30, 2000

(51) Int. Cl.$^7$ .......................... H01L 23/12; H01L 29/12
(52) U.S. Cl. ..................... 257/723; 257/678; 257/916; 361/306.2; 361/306.3
(58) Field of Search ................................ 257/723, 678, 257/916; 361/306.2, 306.3

(56) References Cited

U.S. PATENT DOCUMENTS

| | | | | |
|---|---|---|---|---|
| 5,027,253 A | * | 6/1991 | Lauffer et al. | 361/321 |
| 5,847,951 A | | 12/1998 | Brown et al. | 361/762 |
| 5,939,782 A | | 8/1999 | Malladi | 257/698 |

FOREIGN PATENT DOCUMENTS

| | | | |
|---|---|---|---|
| EP | 0813255 A2 | * | 11/1997 |
| JP | 64-28846 | * | 1/1989 |

OTHER PUBLICATIONS

L. D. Smith et al., "Power Distribution System Design Methodology and Capacitor Selection for Modern CMOS Technology", IEEE Transactions on Advanced Packaging, vol. 22, No. 3, Aug. 1999, pp. 284–291.

R. Shukla et al., "Flip Chip CPU Package Technology at Intel: a Technology and Manufacturing Overview", 1999 Electronic Components and Technology Conference, Jun. 1999, pp. 945–949.

V. K. Nagesh et al., "Challenges of Flip Chip on Organic Substrate Assembly Technology", 1999 Electronic Components and Technology Conference, Jun. 1999, pp. 975–978.

J. Darnauer et al., "Electrical Evaluation of Flip–Chip Package Alternatives for Next Generation Microprocessors", IEEE Transactions on Advanced Packaging, vol. 22, No. 3, Aug., 1999, pp. 407–415.

* cited by examiner

Primary Examiner—Jhihan B Clark
(74) Attorney, Agent, or Firm—Antonelli, Terry, Stout & Kraus, LLP

(57) ABSTRACT

A capacitor assembly having one or more capacitors embedded in the core layer of a package having integrated circuits (ICs) mounted thereon. Each embedded capacitor has plural pairs of first and second electrodes and the package core layer has plural sets of first and second vias dispersed over the pairs of electrodes and being connected thereto. A metal layer is provided on the core layer and includes a first portion having at least one metal strip and a second portion, electrically isolated from each strip. Each metal strip is positioned such that it is extended to overlie both the first electrode of a distinct pair of electrodes and the second electrode of an adjacent, succeeding pair of electrodes and effects a mutual electrical connection between them through first and second vias associated therewith, respectively. A wiring layer which may be a dielectric interlevel connection layer, provided on the metal layer, has plural sets of third vias that are disposed over the center of the capacitor such that adjacently disposed sets of third vias alternate between contacting the individual ones of the metal strips and contacting the second portion of the metal layer to provide interlayer electrical connections therethrough, respectively, to wirings or terminals in the package. The individual metal strips associated with the first portion of the metal layer are to be applied with one of the power and ground reference signals of the package assembly and the second portion thereof is to be applied with the other one of the power and ground voltages. These capacitors may be employed as bypass capacitors in a package assembly for integrated circuits.

43 Claims, 5 Drawing Sheets

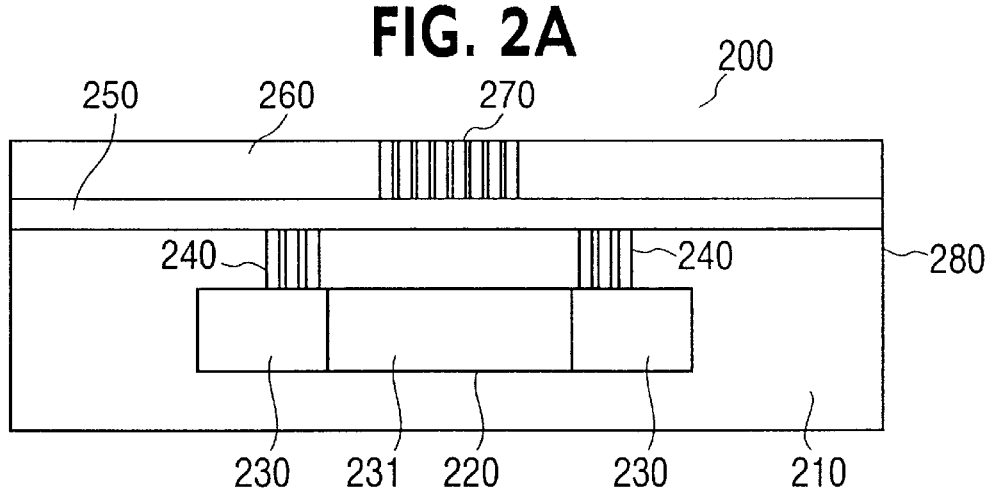
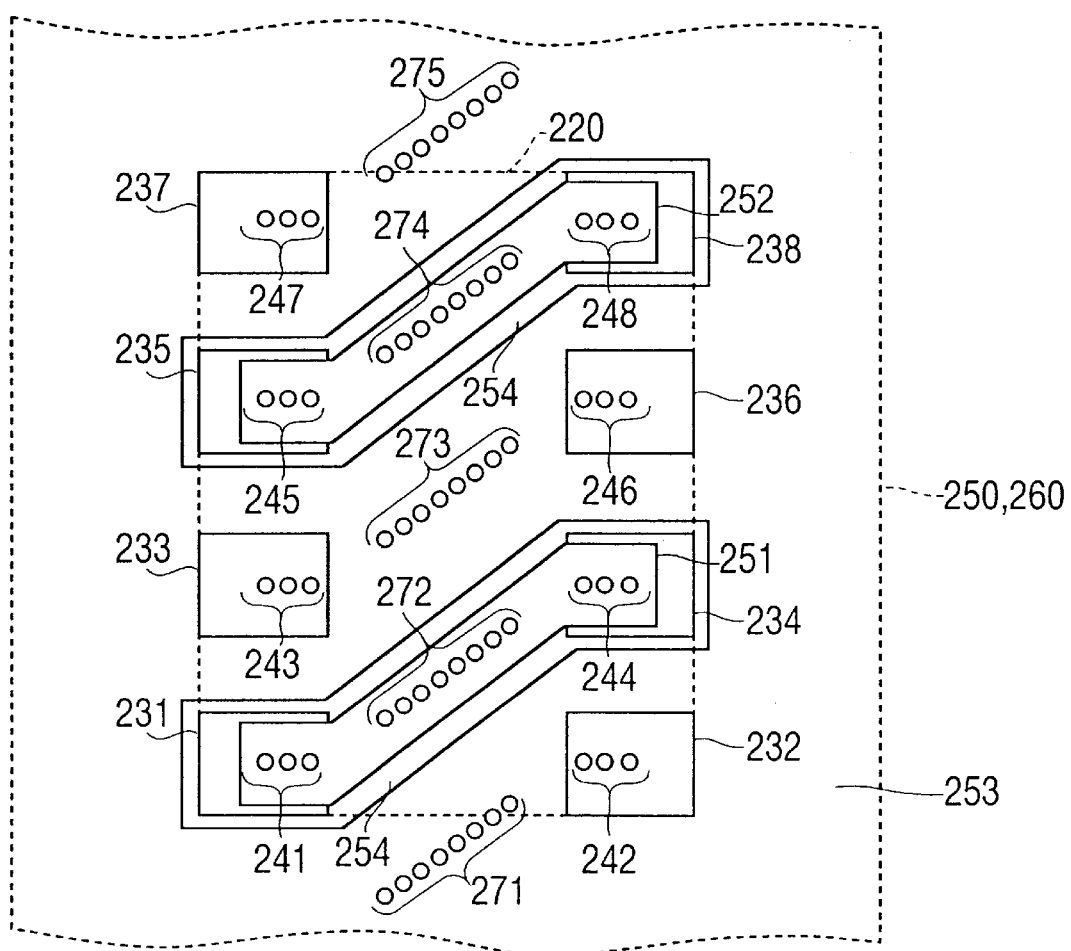

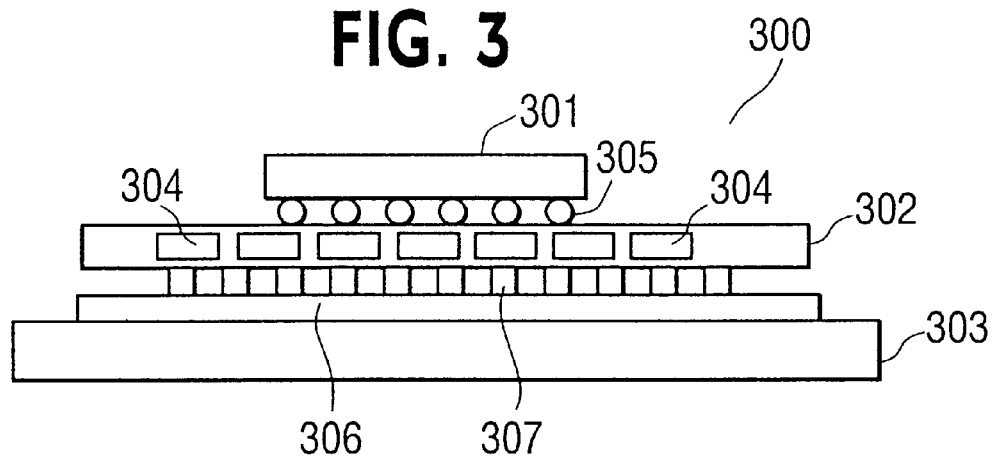
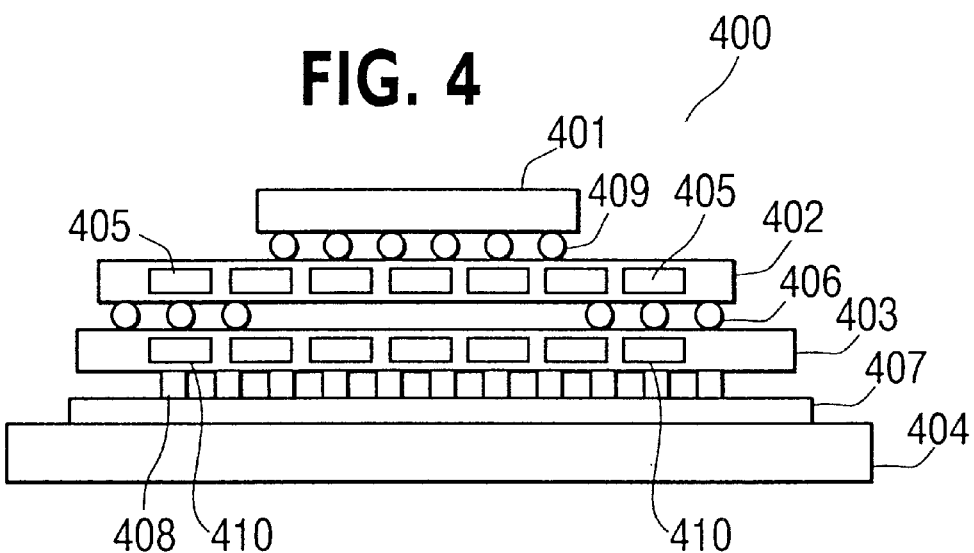
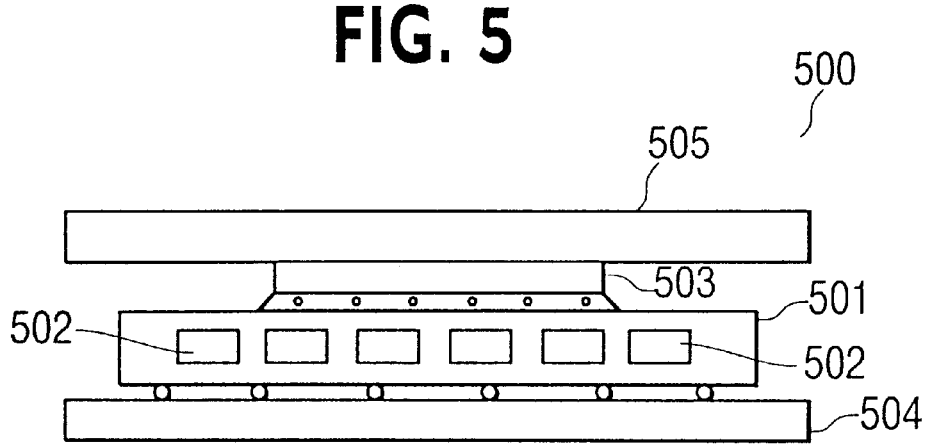

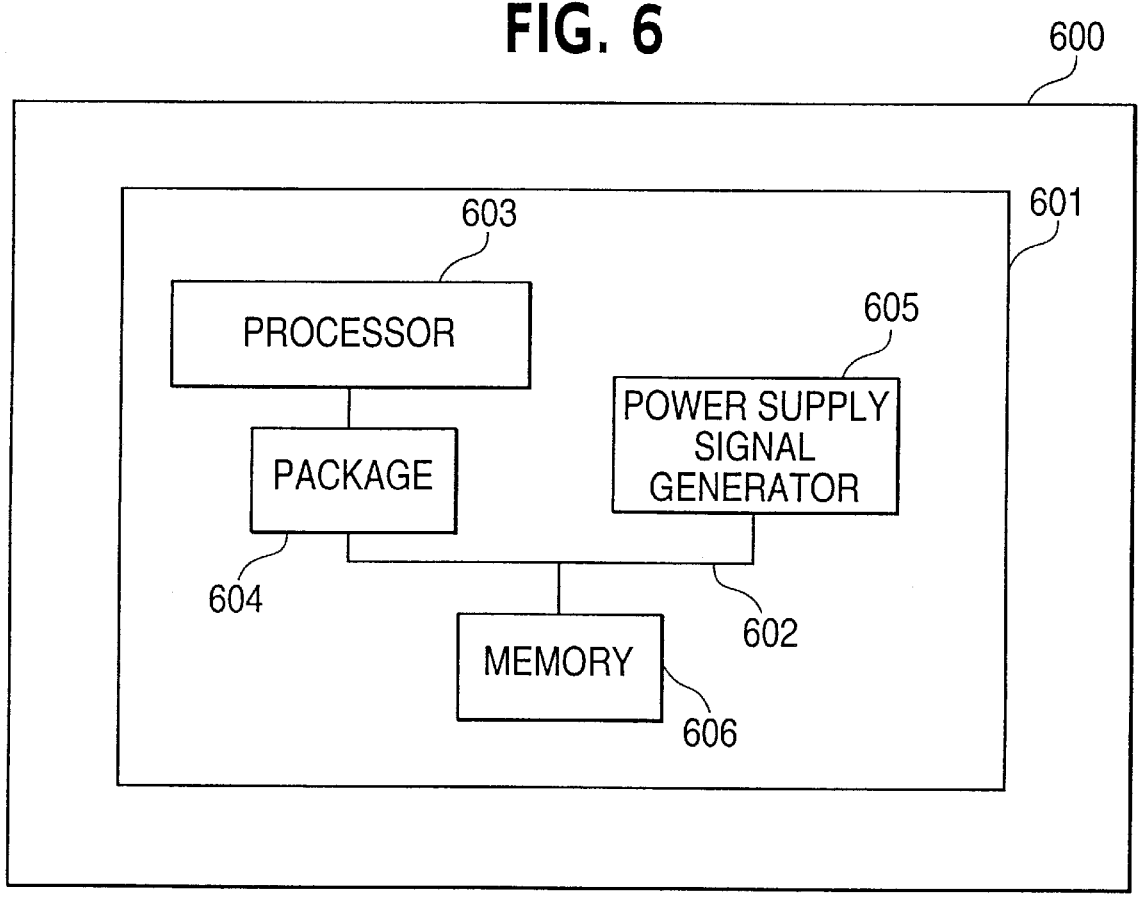

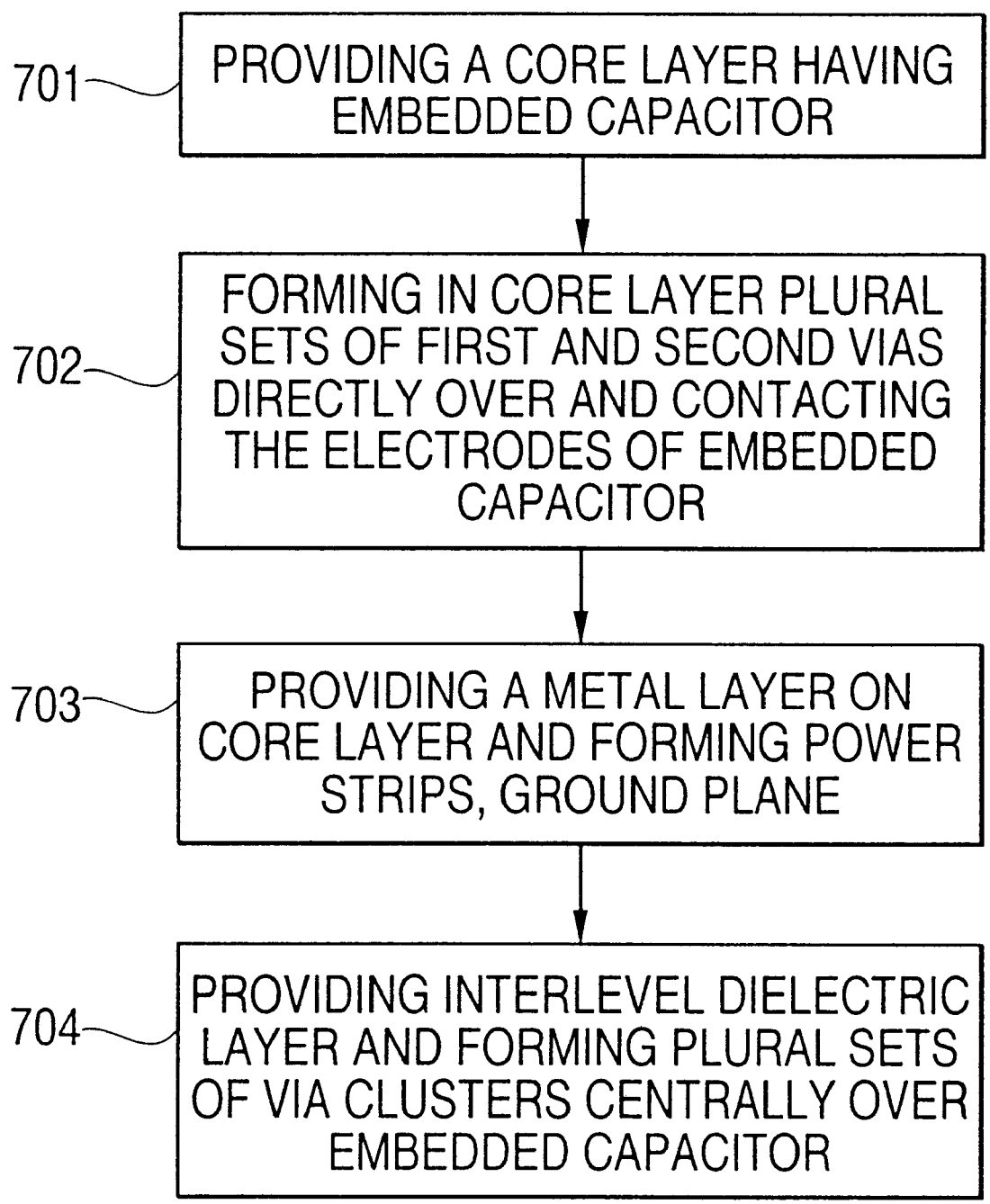

EMBEDDED CAPACITOR ASSEMBLY IN A PACKAGE

FIELD

The present invention relates to integrated circuit packaging and, more particularly, to a package assembly for integrated circuits, electrical system hardware, and computer systems, although not limited thereto.

BACKGROUND

Recent developments in integrated circuit technologies have led to higher levels of performance and faster operation speeds and, also, have led to the development of more complex integrated circuits (ICs). These and other achievements and increased levels of complexity has made it more and more difficult to maintain the power source level applied to an integrated circuit (IC) within a prescribed range. For example, technological achievements in integrated circuit technologies and, especially, in the design of processors have driven the operating frequencies (e.g., clocking speeds) to much higher levels (e.g., the high end of the megahertz [MHz] range) and, correspondingly, are driving voltages as well as noise margins lower and lower.

Typically, in integrated circuit (IC) packages such as for mounting processor dies, among other integrated circuitry, a voltage regulator circuit is used to provide a steady DC voltage. This is irrespective of whether such DC power is from a battery or has been converted from alternating current (AC) power. A known way of providing voltage regulation to a semiconductor die or IC chip is mounting a voltage regulator module (VRM) on the PC board (or motherboard), for example, of a computer system. VRMs, however, are typically ineffective in meeting the power distribution system (PDS) target impedance of ICs at operating frequencies beyond the low end of the kHz range. As a result, therefore, as frequencies and edge rates of ICs and, especially, of high performance processors have escalated greatly, bypass capacitors operating as power decouplers have been utilized to reduce the system noise as well as suppressing unwanted radiation. Extensive discussion regarding the characteristics of a power distribution system (PDS) and use of ceramic capacitors in high speed ICs is given in the published article, entitled "Power Distribution System Methodology and Capacitor Selection for Modem CMOS Technology," L. D. Smith et al., in IEEE Transactions on Advance Packaging, Vol. 22, No. 3, pp. 284–291, August 1999.

In order to provide effective power decoupling capacitors for the next generation of integrated circuits including single chip processors and microcomputers, although not limited thereto, there will be a need for bypass capacitors integrated into the interconnect substrate, for example, a processor die interconnect substrate.

With the development of chip capacitors and vias (and microvias) technology, the embedding of discrete capacitor elements such as multiterminal pair ceramic capacitors has now been made possible. However, the connection of such capacitors leads to inductive noise from the wirings and loops developed by the presence of the vias and various wiring layers electrically connected thereto, including the supply and ground wirings (or power and ground planes). These inductances can adversely affect the PDS performance, especially, at high frequencies and should be taken into account when considering reducing the system noise attributed, for example, to the switching on of power as well as during the actual running of the die or chip circuitry. Therefore, in addition to placing the capacitors inside the processor interconnect substrate or, for example, in any IC package, printed circuit board (PCB) or, for that matter, in the core layer of a motherboard on which high performance semiconductor integrated circuits are mounted, the connection assembly of such embedded capacitors must be such as to maintain the effective inductance resulting from the placement thereof to a sufficiently low level so that a low power distribution system (PDS) impedance is achieved even at frequencies (or clocking speeds) at high ends of the megahertz (MHz) range and beyond.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and is not limited thereto. The spirit and scope of the present invention are limited only by the terms of the appended claims.

The following represents brief descriptions of the drawings, wherein:

FIGS. 2A and 2B are an example illustration of a side view and an upper plan view, respectively, of an embedded capacitor assembly in a package having an optimized via placement design layout according to the present invention;

FIG. 3 illustrates the placement of capacitors in a package assembly according to one embodiment of the present invention;

FIG. 4 illustrates the placement of capacitors in a package assembly according to another embodiment of the present invention;

FIG. 5 illustrates the placement of capacitors in a package assembly according to a further embodiment of the present invention;

FIG. 6 illustrates a general purpose computer system to which the present invention is applied; and FIG. 7 illustrates a method of optimizing the via placement design of embedded capacitors, according to the present invention.

DETAILED DESCRIPTION

Figure 1A:
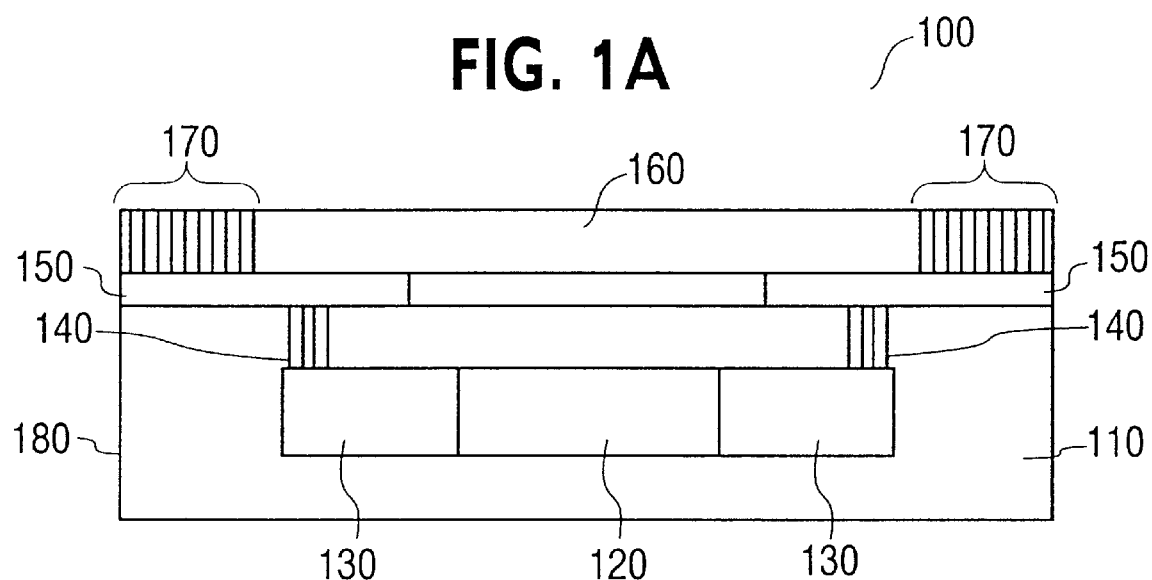
FIGS. 1A and 1B are an example illustration of a side view and an upper plan view, respectively, of an embedded capacitor assembly in a package.

Before beginning a detailed description of the subject invention, mention of the following is in order. In the detailed description of the disclosed embodiments, in terms of relating the same to the present invention, it should be noted that like reference numerals/characters, if any present, in different drawing illustrations are used to designate identical, corresponding or similar components. Further, the drawing illustrations are not drawn to scale and, also, well-known power connections as well as other circuit and/or package components, which are connectable or inherent to the embodiments illustrated, are not all shown within the various examples of the invention illustrated for simplicity of illustration and discussion, and so as not to obscure the invention. Also, the various examples are shown in block form in order to avoid obscuring the invention, and also in view of the fact that specific details thereof with respect to implementation of such block diagram arrangements are highly dependent upon the platform within which the present invention is to be implemented, i.e., specifics should be well within the purview of one skilled in the art.

Although the examples disclosed feature embedding ceramic capacitors in electronic packages, and effecting interlayer connection using laser vias, the invention is not to be considered as being limited thereto. Also, the invention is not to be considered as being limited to only those types of packages and processor assemblies mentioned hereinbelow. Also, any reference to a processor should be understood as also being inclusive of a central processor unit (CPU), a microprocessor, a processor chip, a microprocessor chip, a computer chip, and the like. Still further, reference in the specification to "one embodiment" and the like or "an embodiment" and the like means that a particular feature, structure, or characteristic described in connection with the embodiment is included in at least one embodiment of the invention. The appearances of the phrase "in one embodiment" in various places in the specification are not necessarily referring to the same embodiment.

Figure 1B:
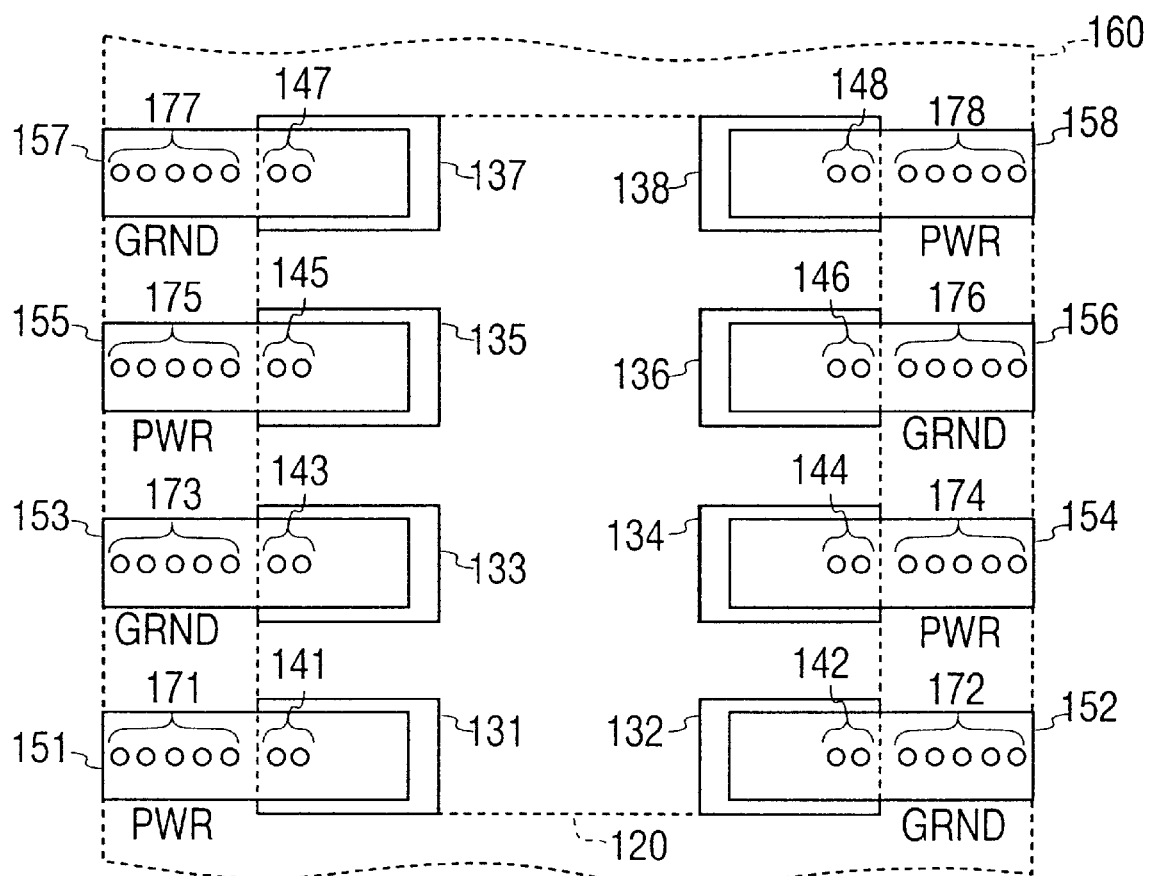

FIG. 1A is an example illustration of a side view of a capacitor assembly in a package and FIG. 1B shows an upper plan view layout of the capacitor assembly looking through the wiring layer 160 side. In the capacitor assembly 100 shown in FIG. 1A, the core layer 110 of the package 180 contains one or more capacitors 120 operatively coupled as bypass capacitors, respectively, so as to decouple power noise signals. Capacitors such as these may be ceramic capacitors which are, typically, multilayered chip capacitors having a plurality of pairs of electrodes. In the example shown hereinbelow, each embedded ceramic capacitor has four pairs of first and second electrodes 130 in which adjacently disposed pairs are reversely applied with a first potential and a reference potential, respectively, the first potential being a DC power supply potential and the second being a reference potential (e.g., circuit ground potential). For example, assuming the first pair of electrodes including first electrode 131 and second electrode 132 thereof are applied with the power supply potential (PWR) and ground (GRND) potential, respectively, the adjacently disposed pair including first electrode 133 and second electrode 134 are applied with the ground potential and the power supply potential, respectively. Consistent with this, the first and second electrodes 135 and 136, respectively, of the third pair are applied with the power supply potential and ground potential, respectively, while the fourth electrode pair, namely, first electrode 137 and second electrode 138 are, respectively, applied with the ground potential and power supply potential, which may be the power supply of the circuitry attached to the package.

The application of the power supply voltage and ground potential is through effecting contact of the individual electrodes 130 (131 to 138) to the individual power and ground strips 151 to 158 of metal layer 150. Using the power source voltage and ground voltage convention discussed above, metal strips 151, 154, 155 and 158 correspond to the power strips while metal strips 152, 153, 156 and 157 correspond to the ground strips. The convention can also be applied alternatively in which case the first electrode 131 of the first pair of electrodes is applied with ground potential while the second electrode 132 of the first electrode pair is applied with the power source potential, and so forth. Vias 170 (171 to 178) in wiring layer 160 connect the plural pairs of electrodes 130, through the metal layer 150, to wirings or power terminals associated with the package.

The electrical connection between the individual pairs of capacitor electrodes and the respectively overlying power and ground strips are effected through the individual sets of first and second vias 140 associated therewith. For example, application of the power supply voltage (PWR) to electrode 131 of the first pair of electrodes is by connecting the power strip (PWR) 151 thereto through the cluster of first vias 141 of the first set. Likewise, the ground reference is applied to the second electrode 132 of the first pair by electrically connecting the ground strip (GRND) 152 thereto by the cluster of second vias 142 of the first set. Similar such electrical connections or contact links are effected between the first and second electrodes of the other electrode pairs (e.g., the second through fourth pairs) to the power (PWR) and ground (GRND) strips associated therewith through the individual via clusters 143 to 148.

Wiring layer 160 may be either an interlevel via connection layer associated with a multilayer wiring laminate of package 180 or may be one that is directly attached to an integrated circuit die or chip such as a processor die or chip, although not limited thereto. As can be seen from the plan view layout arrangement of the power and ground metal strips and via arrangements associated therewith, the vias in the wiring layer 160 (e.g., a dielectric connection layer) are placed away from the center of the core portion of the embedded capacitor. In their efforts at achieving an optimized via placement design for embedded capacitors, especially, in connection with package assemblies for high performance ICs including processors and memories, although not limited thereto, the present inventors have determined that placement of the vias 170 (171 to 178) away from the capacitor 120 leads to inductive noise (the presence of magnetic flux and large loop areas). This has deleterious effects on the overall power distribution (PDS) impedance level of the IC.

The multiterminal embedded chip capacitor (ECC) 120, as shown in FIGS. 1A and 1B, represents one of a number of other such bypass capacitors that are placed in the package for ICs for purposes of effecting power decoupling of noise signals during the turn-on of power as well as when the circuitry is in an operation mode. These capacitors are intended to prevent the voltage from dropping below some preset reference level (e.g., typically set by the voltage regulator module (VRM)). For example, when the processor is initially powered on, it requires large amounts of current and quickly. These bypass capacitors (power decouplers) keep the supply voltage from drooping, especially during turn-on of power. That is, these bypass capacitors, which are placed at various locations in the package, are intended to maintain the voltage level in the presence of current transients at the power/ground wirings (or power/ground planes) to ensure high performance operation by the ICs.

As the frequencies and edge rates of high performance ICs increase—including, for example, high performance processors with clocking rates in the high megahertz (MHz) range and beyond—bypass capacitors play more and more of an important role in reducing system noise. For high end processors, as one example, ceramic capacitors are especially desirable for maintaining the PDS impedance levels at an appropriate low level. There are a number of different types of ceramic capacitors which have a dielectric core including NPO, X7R, X5R, and Y5V as well as several sizes including 1206, 805 and 603, although not limited thereto. These and other known ceramic capacitors as well as others being developed are usable in the MHz range and beyond. However, the manner in which these capacitors are connected in the package assembly becomes even more critical with ever increasing frequencies/clocking speeds, especially, in high performance processors and the like. That is, the effectiveness of a bypass capacitor, especially in high end IC package assemblies, can become degraded by the inductances contributed by wirings and via connections associated therewith. As a result, excessive switching noise can still remain on the power and ground lines/planes. Therefore, it is important to minimize inductances contributed by the connection assembly associated with the bypass capacitors.

Flow of current leads to inductance (inductance is energy stored as magnetic flux). An inductor can be made by a simple coil or wire or a loop. With regard to loops, the inductance increases (decreases) as the area of the loop is increased (decreased). This is also true for bypass capacitors when connected as power decouplers. In the example in FIGS. 1A and 1B, it is noted that because of the considerable spread between the first and second clusters of wires 170, significantly sized loop areas are formed which lead to sizable inductive loops and magnetic flux. For example, there is formed the following inductive loop: Power strip 151, vias 141, capacitor 120, vias 142, and ground plane 152. Such loops are realized by the other connections which are similar thereto. Moreover, the presence of vias 170 (171 to 178) leads to an effective widening of the loop which leads to a much greater inductance and, correspondingly, greater magnetic flux. The effective loop including, for example, via clusters 171, power plane 151, vias 141, capacitor 120, vias 132, ground plane 152, via clusters 172 and further power/ground wirings (or power/ground planes) and the like leads to a significant inductance. Additionally, the magnetic flux resulting from the presence of the metal strips themselves also leads to greater inductive noise.

Considering the drawbacks associated with a metal layer and via design scheme as that discussed with regard to the example in FIGS. 1A and 1B, the present inventors have achieved an improved design scheme therefrom for connecting such bypass capacitors within a package. Such design scheme will now be explained in the further example given with regard to the illustration in FIGS. 2A and 2B.

FIG. 2A is an illustration of a schematic side view and FIG. 2B is an upper plan view thereof of the layout scheme of the embedded capacitor assembly 200 in the package 280 showing an example of an optimized via placement design layout according to the present invention.

The package 280 may be an IC package in a computer system. The IC package itself may be a processor package on which at least a processor die is mounted thereon and in which case the processor die may be also of the flip chip variety. The package may also be a printed circuit board (PCB) or, for that matter, a motherboard on which a processor die or other high-speed circuitry may be mounted on. In addition to PCB or motherboard, the package may be, although it is not limited thereto, a high-speed organic package such as an Organic Land Grid Array (OLGA), a Flip Chip Pin Grid Array (FCPGA) and an interposer. The package in the present application refers to that part of the package assembly having bypass capacitors embedded therein.

For purposes of explaining the present invention in terms of the example in FIGS. 2A and 2B, a similar type of package and material thereof is assumed for this example as with respect to the FIGS. 1A and 1B example, although not limited thereto. That is, at least one capacitor (e.g., a multilayered chip capacitor which may be a ceramic capacitor, although not limited thereto) is embedded in core layer 210 of the package, the core layer may be an organic substrate such as made of epoxy material (e.g., standard PCB materials are: FR-4 epoxy-glass, polyimide-glass, benzocyclobutene, Teflon, other epoxy resins, or the like). The embedded capacitor 220 is typified by a core portion 231 and plural pairs of electrodes 230 (231 to 238), uniformly arranged along its opposing sides. In this example, also, there are four pairs of electrodes in which 231, 233, 235 and 237 represent the first electrodes and references 232, 234, 236 and 238 are the second electrodes of the plural pairs of electrodes, respectively. For purposes of this discussion, let 231–232 represent the first pair of electrodes, 233–234 represent the second pair of electrodes, 235–236 represent the third pair and 237–238 represent the fourth pair of electrodes in an embedded capacitor 220. In this arrangement, the first and third pair of electrodes have the same biasing thereacross while the second and fourth pairs of electrodes have the same biasing thereacross, but opposite to that of the first and second pairs of electrodes, respectively.

Assuming embedded capacitor 220 is connected as a bypass capacitor, similarly as that of the earlier example, the power and ground voltages are applied to each of the electrodes of the four pairs of electrodes through the metal layer 250 and the plural sets of first and second vias 240 (241–248). Unlike the arrangement of the individual metal strips associated with each of the electrodes as depicted in FIG. 1 of the drawings (which lead to placement of the vias outside of the plan view area of the capacitor), the part of the metal layer in the vicinity of each of the embedded capacitors is made up of a first portion including at least one metal strip in the present instance, including metal strip 251 and metal strip 252) and a second portion 253 which is electrically isolated from the plural metal strips. More particularly, the first portion, which includes metal strips 251 and 252, is formed from the same metal layer 250 as that corresponding to the second portion 253. The individual strips 251 and 252 (herein, referred to also as power strip connects) constitute the first portion of the metal layer and are spatially isolated from the second portion 253 thereof via a spatial ring 254 around each of them so as to effect electrical isolation between portion 253 and each of the power strip connects 251 and 252. The electrically isolating spatial areas 254 surrounding each of the diagonally shaped metal strips are shaped to conform to that of the metal strips. Such electrical isolation is necessary in order to prevent contact between the metal strips (applied with power source voltage) and metal portion 253 which acts as the ground plane. (Alternatively, portion 253 may, instead, act as the power plane portion and the metal strips 251 and 252 may be tied to the ground potential.)

Through implementing such a metal layer in the form as that shown in FIG. 2B, in which each of the metal strips (power strip connects) is extended so that opposite ends (e.g., end portions) thereof cover the first electrode of a distinct pair of capacitor electrodes as well as the second electrode of a succeeding adjacent pair thereto, a mutual electrical connection can be effected between those two electrodes through the first and second vias associated therewith, respectively. For example, metal strip 251, which is diagonally extended, has opposing end portions thereof that overlie the first electrode 231 of the first electrode pair as well as the second electrode 234 of the second pair of electrodes in a manner which permits a mutual electrical connection of those two electrodes through the first vias, associated with the first electrode 231, and the second vias 244, associated with the second electrode 234. In a similar manner, metal strip (power strip connect) 252 mutually connects first electrode 235 of the third pair with the second electrode 238 of the fourth pair of electrodes through the first clustered vias 245, associated with the first electrode 235 of the third pair, and the clustered second vias 248, associated with the second electrode 238 of the fourth pair of electrodes. In addition to this, the remaining four electrodes, of the four pair of electrodes shown in FIG. 2B, are electrically connected to the ground plane 253 through individual clusters of first or second vias, as detailed in FIG. 2B. As a result, therefore, a similar type of power/ground connection biasing arrangement for the bypass capacitor 220 is implemented with regard to the example shown in FIGS. 2A and 2B as that depicted in FIGS. 1A and 1B. Namely, electrodes 231 and 234 as well as 235 and 238 are applied with power source voltage (e.g., the circuit power supply associated with the package assembly) while terminals 232, 233, 236 and 237 are applied with the reference voltage (e.g., ground voltage) of the ground plane. It is noted that for discrete embedded capacitors having an even number of pairs of electrodes, for example, four pairs of first and second electrodes such as shown in this example, the number of strips may be equal to half the number of pairs of electrodes.

As stated earlier, ceramic chip capacitors are known and have been available for connection as bypass capacitors to effect power decoupling of noise signals. However, embedding such capacitors in a manner as that disclosed herein, especially, with regard to the example in FIGS. 2A and 2B, is clearly a new and novel approach.

As a result of implementing a metal strip arrangement as that shown in FIG. 2B, the third vias 270 in the wiring layer 260, which provide electrical connections to other ones of wirings or power terminals associated with the package assembly, are now disbursed as plural sets of third vias over the center of the embedded capacitor. In this example, the plural sets of third vias (271, 272, 273, 274, 275) are centered over the core section (between the electrodes of the ceramic capacitor) such that each set contacts either a distinct power metal strip or the ground plane 253. For example, the via set 271 are arrayed in a cluster and contact the ground plane 253, the via set 272 are arrayed in a cluster and contact the metal strip 251, which is mutually electrically connected to electrodes 231 and 234 through via sets 241 and 244, respectively. The clustered array of third vias 273 as well as the clustered array third vias 275 are similarly disposed as that of 271. The clustered array of third vias 274 are positioned so as to effect contact at one of the ends thereof to the metal strip 252, which strip provides a mutual electrical connection of the electrodes 235 and 238 through the first and second via sets 245 and 248, respectively. Through this via placement design scheme, in conjunction with the formation of power strip connects, such as in the example shown in FIG. 2B, although not limited thereto, a significantly lower effective loop inductance results over that of known/conventional design schemes and, for that matter, also, over the via placement approach in the example of FIGS. 1A and 1B, discussed earlier.

Incidentally, each terminal of the capacitor may be associated with one, two or three or, for that matter, as many vias as the terminal side permits to lower both the connection resistance and inductive noise. Likewise, the individual sets of third vias 271–275 should be clustered together as much as the capabilities of the manufacturing processes permit. The number of vias in each cluster of first, second and third vias may be limited based on the allowed pitch of the vias and the size of the electrodes and length of the diagonal portion of the metal strips. Also, in addition to centrally positioning the clusters of third vias over the area covered by the capacitor, it is also beneficial to cluster the sets of first and second vias as closely as possible to the inner edges of the capacitor pads so as to reduce the size of the effective inductive loops even further (the capacitor pads relate to the electrodes 231–238 themselves).

Regarding the capacitor itself, it is placed inside the package 280 or, more particularly, inside the core layer which may be a polyimide substrate or, for that matter, any known type of substrate material for PCBS, motherboards, IC package assemblies or IC dies (e.g., processor dies), although not limited thereto. Specifically, as shown by the process in FIG. 7, the OEM (vendor or original equipment manufacturer) first embeds the capacitor into the core layer of the package (701 in FIG. 7). This may be done by any known process of cutting a hole in the core layer of the package substrate so as to place thereinto the capacitor. The embedded capacitor has an encapsulant formed around it and a dielectric is placed in the hole above the capacitor to hold the capacitor in place. Subsequent to this, vias are formed through the front face of the core layer 210 above the respective capacitor electrode pads 702. These vias may be laser vias, as one example, although not limited thereto. For example, although not limited thereto, once the capacitor is fully embedded in the core layer, holes are made by laser drilling of the dielectric core layer to expose the capacitor pads to the metal layer 250 to be provided thereover. These laser holes are then plated and become laser vias. Laser vias represents one example of known types of via (or micro via) forming techniques (in fact there are also a number of known different processes for producing laser vias). Subsequently to the formation of the metal strips of the wiring layer 250 (703), the dielectric layer 260 is provided thereover followed by the formation of the plural sets of third vias centrally over the capacitor (704). Processes available in connection with the manufacture, for example, of wiring boards, PCBs including OLGAs and other types of organic substrates, although not limited thereto, which are known in the art, in connection with the manufacture of package assemblies for high speed/high performance ICs including high performance/high speed processors, may be applied towards the manufacture of an optimized via placement design, according to the present invention. This optimized via placement design scheme is particularly advantageous for high performance/high-speed packages such as OLGA (Organic Land Grid Array) and FCPGA (Flip Chip Pin Grid Array) and the like, although not limited thereto.

In connection with such via placement design layout, performance is improved more so when spacing between vias is reduced in addition to being centrally positioned. Also, the number of vias included in each of the sets 271–275, for example, should be maximized and positioned as closely as possible to the capacitor's center. However, the number of vias, of course, is limited by the capacitor size and available pitch. In addition, the metal strips (power strip connects), which are extended over the center of the capacitor and are used to connect to the ICs power supply, are mutually coupled to the front side of the core of the capacitor. Clearly, therefore, the current path associated with this arrangement shown in FIGS. 2A and 2B leads to a smaller loop inductance area than that resulting from the example in FIGS. 1A and 1B. Further, the magnetic flux resulting from current on the metal layer above the capacitor and the current in the capacitor, effectively, cancel each other. This becomes maximized as a result of the via connection of the front side of the core layer 210 to the front side of the interlevel connection layer 260 being centered over the capacitor. The cancellation of the magnetic flux as well as the attainment of a smaller overall loop area leads to a lower loop inductance of the overall PDS.

It is emphasized, the optimized via placement design, according to the present invention, provides for a much lower loop inductance than would be typically expected from conventional approaches and also is achievable with little or no additional cost involved in implementing a design scheme such as with regard to FIGS. 2A and 2B, although not limited thereto. That is, the design scheme in the example according to FIG. 2A and 2B not only leads to the minimizing of the loop inductance through optimizing the via placement design but, achieves this without increasing the effective cost. This minimizing of loop inductance is particularly advantageous in high performance/high-speed processors and will be even more so in next generation processors in connection with increasing the yield and reduce the number of bypass capacitors needed internally in the processor interconnect substrates. Increasing the yield as well as reducing the number of bypass capacitors leads to a reduction in the overall cost of manufacturing processor package assemblies.

FIG. 3 of the drawings illustrates the embedding of one or more capacitors such as of the type discussed above, although not limited thereto, in an electronic package assembly such as for a computer system (although not limited thereto). In accordance with this, the package assembly 300 features an integrated circuit 301 which is housed by IC package 302. Integrated circuit (IC) 301 may contain one or more circuits which are electrically connected to the package 302 by connectors 305. Although the connectors 305 are illustrated as bump (ball) type electrodes, other types of external electrical connections may be used including but not limited to pins. These circuits may act as the intended load to which power is supplied by the package assembly VRM. Although not shown herein, a voltage regulated power supply which may be provided in a VRM of a known type may be mounted on a motherboard PCB, an IC package on which the IC circuitry is mounted on or even on an interposer, if one is employed.

Integrated circuit 301 could be any of a number of today's high performance/high-speed processors which may be employed in servers or network systems or otherwise and may be other types of circuits and include, also, combinations thereof. In the embodiment shown in FIG. 3, integrated circuit 301 may be a flip chip mounted processor or may be representative of a plurality of chips or a combination of different types of circuits including high-performance/high-speed devices or chips, although not limited thereto. The example shows a flip chip type of IC which is bump (ball) mounted (305) on an upper surface of IC package 302. Alternatively, the integrated circuit 301 may employ other known flip chip technologies or, for that matter, may be a surface mounted chip, in which input/output terminals thereof are connected to the IC package 302 using bond wires for connecting the upper surface of the chip to bonding pads at the upper surface of IC package 302. As can be seen from this example, a number of embedded capacitors 304 may be incorporated into the IC package, as deemed necessary, for achieving a target power distribution system impedance, for example.

IC package 302, in FIG. 3, is coupled to a socket 306 which is on a motherboard or PCB 303. If the pins 307 of IC package 302 are properly made with complementary pin holes in the PCB or motherboard 303, then socket 306 which is used for mating (interfacing the pin layout of the IC package 302 with that of board 303) may not be necessary. That is, IC package 302 could be electrically directly physically connected to board 303 using solder connections, for example, ball grid array (BGA) connections or Pin Grid Array (PGA) connections, although not limited thereto. The motherboard or PCB may be in a computer system, although not limited thereto. The processor may also be of the control collapse chip connection (C4) type.

Through incorporating embedded capacitors in an electronic package such as that illustrated in FIG. 3, although not limited thereto, loop inductance noise resulting from bypass capacitor connections including via connections can be mitigated substantially thereby leading to an improvement in the overall power distribution system (PDS). In this connection, the embedded capacitors become especially effective as power decouplers when they are positioned, in the core of the package, underneath the IC die and the like.

Integrated circuit (IC) packages may also be connected to a PCB or motherboard through an interposer, which acts as a dimensional interface between the IC package connectors and connectors on the board. If the electronic package assembly is using an interposer, which may be considered as an additional wiring substrate, the bypass capacitors for effecting power decoupling of transient signals may be embedded therein, for example, in a core dielectric layer thereof, either in place of being embedded in the IC package itself or the distribution of the bypass capacitors may include embedding one or more such capacitors in the interposer in addition to embedding one or more in the IC package itself. Alternatively, all of the embedded capacitors may be incorporated in the core layer of the interposer, depending on the particular design approach being used by the vendor (OEM).

FIG. 4 of the drawing shows an electronic package assembly 400 such as used for a computer system which employs an interposer 403 for interfacing the IC package connectors 406 and connectors of the board 404 (socket 407 may or may not be needed). Herein, also, although bump electrodes (balls) 406, 409 and pins 408 are illustrated, the electronic package assembly, containing embedded capacitors according to the present invention, may also be employed in connection with packages and boards, interposers and the like having different types of external electrode connections, such as earlier discussed. Similarly, the integrated circuit 401, which is shown to be bump (flip chip) mounted, should not be construed as being limited thereto. Numerals 405 and 410 represent embedded capacitors that may be incorporated into the IC package 402, the interposer 403 or even in both.

FIG. 5 shows an electronic package assembly, according to the invention, featuring an organic land grid array (OLGA) package 501, incorporating embedded capacitors 502 each having a connection arrangement such as shown in FIGS. 2A and 2B, although not limited thereto. The OLGA assembly has a flip chip mounted integrated circuit which may be a high performance/high frequency processor 503. The OLGA package 501 is bump (ball) mounted on a motherboard 504. 505, which is mounted on the backside of the processor 503 provides heat management (e.g., acts as a heat sink). As to OLGA packaging technologies, they are basically directed to recently developed high performance/high frequency processors operating at the high megahertz (MHz) clocking speeds and beyond and are, especially, advantageous in processors used in servers, etc. OLGA packaging technologies have been recently developed and are known to those skilled in packaging technologies. Alternatively, the package substrate 501 may be a flip chip pin grid array (FCPGA) or, for that matter, other types of ball grid arrays (BGA) or pin grid array (PGA) package types may be employed, although not limited thereto.

The IC packages and interposer described in connection with FIGS. 3 and 4 may be connected to a PCB or motherboard which forms part of a computer system such as, for example, a general purpose computer system, although not limited thereto.

FIG. 6 illustrates a general purpose computer system 600 that includes, according to the invention, one or more embedded capacitors, as deemed necessary in accordance with the various embodiments of the present invention. Computer system 600 is housed on a PCB or motherboard 601 and includes at least one bus 602, a processor (e.g., microprocessor chip) 603, an IC package 604 that may or may not contain an interposer and socket, a power supply signal generator 605, and a memory 606. The package and/or interposer 604 electrically connects the processor 603 to the bus 602 so as to communicate power supply signals and non-power supply signals (e.g., data signals, control signals, address signals, etc.) between the processor 603 and circuit or devices coupled to bus 602.

It should also be understood, a computer which has an embedded capacitor assembly, according to the invention, is not necessarily limited to that illustrated in FIG. 6. For example, the processor 603 may be coupled to the memory 606 and to the power supply signal generator through separate buses and that the computer system may include one or a plurality of separate such components as that illustrated in FIG. 6. Also, as stated earlier, the power supply signal generator may be positioned other than on the PC board or motherboard 601.

The present invention is particularly directed to via and power strip placement design in connection with embedded capacitors which are incorporated as bypass capacitors such as for decoupling transient noise signals and minimizing inductive loop noise signals which would otherwise adversely affect the PDS target impedance for the package assembly. Particular processes employed in connection with the actual embedding process are readily available to the vendor (OEM) fabricating the design. It should also be understood that embedded capacitors are not necessarily limited to the type mentioned earlier in this application. Other types of capacitors even ones that are presently or will be developed are applicable herein since the invention is particularly directed to the minimizing of inductive noise arising from the actual embedding of the capacitors and the connection thereof to power/ground planes, supply line wirings as well as to other wiring connections. It should also be understood that the embedded capacitors are not necessarily limited to capacitors which are coupled as bypass capacitors for decoupling noise signals in supply lines but may be other capacitors also having electrode connections running through substrates using via placements.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. For example, plural IC dies may be mounted on a single package substrate and a plurality of package substrates may be mounted on a PCB or motherboard and the like. Also, the type, characteristics and design of IC dies (chips) may affect the location of placement of various components and bypass capacitors, the selection of the capacitor and other aspects of implementation. Further, a variety of materials, component types and implementation techniques may be used.

What is claimed is:

1. A capacitor assembly in a package, comprising:
    at least one capacitor embedded in a core layer of the package, each embedded capacitor having plural pairs of first and second electrodes, and said core layer having plural sets of first and second vias dispersed over said plural pairs of electrodes and connected to the plural pairs of electrodes, respectively;
    a metal layer on said core layer, over each of said at least one capacitor, and comprised of a first portion including at least one metal strip, and a second portion, electrically isolated from said at least one strip, each of said at least one metal strip overlies both the first electrode of a distinct pair of electrodes and the second electrode of an adjacent pair of electrodes and effects a mutual electrical connection between them through the first and second vias associated therewith, respectively; and
    a connection layer, on said metal layer, having third vias to provide electrical connections including between the first and second electrodes, through said metal layer, and wirings or power terminals associated with said package, respectively.

2. The capacitor assembly in a package according to claim 1, wherein said at least one capacitor comprises one or more ceramic capacitors operatively coupled as bypass capacitors, respectively.

3. The capacitor assembly in a package according to claim 1, wherein said at least one metal strip includes a plurality of metal strips.

4. The capacitor assembly in a package according to claim 1, wherein said package is an integrated circuit (IC) package on which one or more integrated circuits are mounted thereon, in a computer system.

5. The capacitor assembly in a package according to claim 1, wherein said package includes one of a printed circuit board (PCB), a motherboard, an organic land grid array (OLGA), a flip chip pin grid array (FCPGA) and an interposer.

6. The capacitor assembly in a package according to claim 2, wherein at each ceramic capacitor, the first electrodes and the second electrodes thereof are located at respectively opposing sides of a core section of the ceramic capacitor and form a substantially uniform distribution pattern between them.

7. The capacitor assembly in a package according to claim 6,
    wherein each ceramic capacitor is a multilayered chip capacitor having four pairs of first and second electrodes, and
    wherein said at least one metal strip consists of two metal strips.

8. The capacitor assembly in a package according to claim 6, wherein said at least one metal strip includes a plurality of metal strips.

9. The capacitor assembly in a package according to claim 8, wherein said third vias in said connection layer are comprised of plural sets of third vias dispersed, with respect to a plan view layout, over the center of the core section of said ceramic capacitor, each set of third vias being located such that a mutual contact is made by the third vias in that set to either said second portion or to a metal strip.

10. The capacitor assembly in a package according to claim 9, wherein said plural sets of third vias are arrayed such that adjacently successive sets alternate between contacting the individual ones of the metal strips and contacting said second portion to provide interlayer electrical connections therethrough, respectively, from first electrodes of odd-numbered pairs and second electrodes of even-numbered pairs to ones of wirings or power terminals in said package applied with a power supply voltage and from first electrodes of even-numbered pairs and second electrodes of odd-numbers pairs to other ones of wirings or terminals in said package applied with a reference voltage.

11. The capacitor assembly in a package according to claim 3, wherein said connection layer is an interlevel wiring connection layer of a multilayered wiring substrate included in the package.

12. The capacitor assembly in a package according to claim 3, wherein said plurality of metal strips are to be commonly applied with one of a first potential and a second potential, respectively, and said second portion is to be applied with the other one of the first and second potentials.

13. The capacitor assembly in a package according to claim 3, wherein said plural pairs of first and second electrodes are arrayed such that the first electrodes are substantially uniformly dispersed at one side of the embedded capacitor and the second electrodes are likewise dispersed at a second, opposing side of the capacitor, and wherein said plurality of metal strips are narrow shaped metal strips dispersed such that each strip is substantially diagonally extended so that opposing ends thereof act as via landings which overlie the first electrode of a distinct pair of electrodes and the second electrode of an adjacently succeeding pair of electrodes and which contact the first and second vias associated therewith at said via landings, respectively.

14. The capacitor assembly in a package according to claim 12, wherein said first potential is a power source potential and said second potential is a reference potential.

15. The capacitor assembly in a package according to claim 4, wherein said IC package is a package on which at least a processor die is mounted thereon.

16. The capacitor assembly in a package according to claim 13, wherein the third vias, in said connection layer, are comprised of plural sets of third vias dispersed, with respect to a plan view layout, centrally over the embedded capacitor between the first and second electrodes of the successive arrangement of said plural pairs of first and second electrodes, respectively, and wherein said plural sets of third vias are arrayed such that adjacently disposed ones alternate between contacting the individual ones of the metal strips and contacting said second portion to provide interlayer electrical connections therethrough, respectively, from first electrodes of odd-numbered pairs and second electrodes of even-numbered pairs to ones of wirings or power terminals in said package applied with a d.c. voltage supply and from first electrodes of even-numbered pairs and second electrodes of odd-numbered pairs to other ones of wirings or other terminals in said package applied with a reference voltage.

17. The capacitor assembly in a package according to claim 16, wherein each set of third vias includes an array of closely clustered third vias, the array being directioned along the diagonal extension of each metal strip.

18. An electronic package assembly comprising a carrier substrate, a package on said carrier substrate and at least one integrated circuit on said package, said package comprising:

a core layer having at least one capacitor embedded therein, each said capacitor having plural pairs of first and second electrodes successively arranged, and said core layer having plural sets of first and second vias dispersed over the plural pairs and connected to the plural pairs of electrodes, respectively;

a metal layer on said core layer over each of said at least one capacitor and comprised of a first portion including at least one metal strip, to be applied with one of a first potential and a second potential, and a second portion, electrically isolated from said at least one metal strip, respectively, to be applied with the other one of the first and second potentials, said at least one metal strip being dispersed such that each metal strip overlies both the first electrode of a distinct pair of electrodes and the second electrode of a succeeding pair of electrodes and effects a mutual electrical connection between them through the first and second vias associated therewith, respectively; and at least one wiring layer on said metal layer and having third vias to provide interlayer electrical connections including between the first and second electrodes, through said metal layer, and wirings or power terminals associated with said package assembly.

19. The electronic package assembly according to claim 18, wherein said at least one capacitor comprises one or more bypass capacitors each coupled to maintain a stable, substantially noise-free pre-set operating voltage associated with said package assembly.

20. The electronic package assembly according to claim 18, wherein said at least one capacitor comprises one or more ceramic capacitors operatively coupled as bypass capacitors, respectively.

21. The electronic package assembly according to claim 18, wherein said at least one metal strip includes a plurality of metal strips, and wherein the third vias in said at least one wiring layer are comprised of plural sets of third vias dispersed, with respect to a plan view layout, centrally over the embedded capacitor.

22. The electronic package assembly according to claim 18, wherein said package includes an integrated circuit (IC) package.

23. The electronic package assembly according to claim 18, wherein said package includes one of a printed circuit board (PCB), an organic land grid array (OLGA), a flip chip pin grid array (FCPGA), and an interposer.

24. The electronic package assembly according to claim 18, wherein said plural pairs of first and second electrodes of each embedded capacitor are arrayed such the first electrodes are substantially uniformly dispersed at one side of the embedded capacitor and the second electrodes are likewise dispersed at a second, opposing side of the capacitor, wherein said at least one metal strip includes a plurality of metal strips, and wherein said plurality of strips are narrow shaped metal strips dispersed such that each strip is substantially diagonally extended so that opposing ends thereof act as via landings which overlie the first electrode of a distinct pair of electrodes and the second electrode of an adjacently succeeding pair of electrodes thereto and which effect contact with the first and second vias associated therewith at said via landings, respectively.

25. The electronic package assembly according to claim 19, wherein said one or more bypass capacitors are multilayered chip capacitors, respectively.

26. The electronic package assembly according to claim 21, wherein said plural sets of third vias are arrayed such that adjacently disposed ones alternate between contacting the individual ones of the metal strips and contacting said second portion to provide interlayer electrical connections therethrough, respectively, from first electrodes of odd-numbered pairs and second electrodes of even-numbered pairs to ones of wirings or power terminals in said package assembly, and from first electrodes of even-numbered pairs and second electrodes of odd-numbered pairs to other ones of wirings or other power terminals in said package assembly.

27. The electronic package assembly according to claim 26, wherein said at least one wiring layer is comprised of a multilayered wiring laminate, the innermost layer thereof being an interlevel dielectric layer including at least said third vias to provide interlayer connections.

28. The electronic package assembly according to claim 27, wherein said wirings or power terminals are comprised of at least one of wire tracings and power supply planes embedded in said multilayer wiring laminate.

29. The electronic package assembly according to claim 27, wherein said first potential is a power source potential and said second potential is a reference potential.

30. The electronic package assembly according to claim 22, wherein said package is a package on which at least a processor die is mounted thereon.

31. The electronic package assembly according to claim 24, wherein the third vias, in said wiring layer, are comprised of plural sets of third vias dispersed, with respect to a plan view layout, centrally over the capacitor between the first and second electrodes of the successive arrangement of said plural pairs of first and second electrodes, respectively, and wherein said plural sets of third vias are arrayed such that adjacently disposed ones alternate between contacting the individual ones of the metal strips and contacting said second portion to provide interlayer electrical connections therethrough, respectively, from first electrodes of odd-numbered pairs and second electrodes of even-numbered pairs to ones of wirings or power terminals in said package assembly, and from first electrodes of even-numbered pairs and second electrodes of odd-numbered pairs to like other ones of wirings or other power terminals in said package assembly.

32. The electronic package assembly according to claim 31, wherein said at least one capacitor comprises one or more ceramic capacitors operatively coupled as bypass capacitors, respectively.

33. The capacitor assembly in a package according to claim 31, wherein each set of third vias includes an array of closely clustered plural vias, the array being directioned along the diagonal extension of each metal strip.

34. The electronic package assembly according to claim 32, wherein said plurality of strips of said first portion are applied with a power source potential, respectively, and said second portion is applied with a reference potential.

35. Embedded capacitor assembly with optimized via placement design to reduce inductive noise in an integrated circuit package, comprising:

at least one capacitor embedded in a core layer of the package, each embedded capacitor having plural pairs of first and second electrodes, and said core layer having plural sets of first and second vias dispersed over said plural pairs of electrodes and connected to the plural pairs of electrodes, respectively;

a metal layer on said core layer, over each of said at least one capacitor, and comprised of a first portion including at least one metal strip, and a second portion, electrically isolated from said at least one strip, each of said at least one metal strip overlies both the first electrode of a distinct pair of electrodes and the second electrode of an adjacent pair of electrodes and effects a mutual electrical connection between them through the first and second vias associated therewith, respectively; and a connection layer, on said metal layer, having third vias to provide electrical connections including between the first and second electrodes, through said metal layer, and wirings or power terminals associated with said package, respectively.

36. The embedded capacitor assembly according to claim 35, wherein said at least one strip includes a plurality of strips for each of said at least one capacitor.

37. The embedded capacitor assembly according to claim 36, wherein the third vias, in said wiring layer, are comprised of plural sets of third vias dispersed, with respect to a plan view layout, centrally over the embedded capacitor, and wherein said plural sets of third vias are arrayed such that adjacently disposed ones alternate between contacting the individual ones of the metal strips and contacting said second portion to provide interlayer electrical connections therethrough, respectively, from first electrodes of odd-numbered pairs and second electrodes of even-numbered pairs to ones of wirings or power terminals in said package, and from first electrodes of even-numbered pairs and second electrodes of odd-numbered pairs to other ones of wirings or other terminals in said package.

38. The embedded capacitor assembly according to claim 37, wherein said plurality of strips are narrow shaped metal strips dispersed such that each strip is substantially diagonally extended so that opposing ends thereof act as via landings which overlie the first electrode of a distinct pair of electrodes and the second electrode of an adjacently succeeding pair of electrodes thereto and which effect contact with the first and second vias associated therewith at said via landings, respectively, and wherein each set of third vias includes an array of closely clustered plural vias, the array being directioned along the diagonal extension of each metal strip.

39. Method to reduce embedded capacitor induced inductive noise in a package, comprising:

providing a core layer of the package with at least one capacitor embedded therein, each embedded capacitor having plural pairs of first and second electrodes, the plural first and second electrodes being substantially uniformly dispersed on opposing sides of the embedded capacitor;

forming plural sets of first and second vias in said core layer, said vias being dispersed over said plural pairs of electrodes, respectively, of each embedded capacitor;

providing a metal layer on said core layer over each embedded capacitor, said metal layer having a first portion including a plurality of metal strips, to be applied with one of a power supply voltage and reference ground, and a second portion, electrically isolated from and surrounding said plurality of strips, respectively, to be applied with the other one of the power supply voltage and reference ground, the metal strips being positioned such that each one overlies both the first electrode of a distinct pair of electrodes and the second electrode of an adjacent pair of electrodes thereto and contacts the first and second vias associated therewith, respectively; and providing an interlevel connection layer, on said metal layer, with plural sets of third vias therein substantially dispersed, with respect to a plan view layout, centrally over the embedded capacitor such that the plural sets of third vias alternate between making contact to individual ones of the plural metal strips and said second portion, respectively.

40. The method according to claim 39, wherein each metal strip has a narrow shape and is diagonally extended so that opposing ends thereof act as via landings overlying the first electrode of a distinct pair of electrodes and the second electrode of an adjacently succeeding pair of electrodes and effecting contact with the first and second vias associated therewith at said via landings, respectively.

41. A computer system having a package assembly comprising a carrier substrate, a package on said carrier substrate and at least one integrated circuit on said package, said package comprising:

a core layer having at least one capacitor embedded therein, each said capacitor having plural pairs of first and second electrodes successively arranged, and said core layer having plural sets of first and second vias dispersed over the plural pairs and connected to the plural pairs of electrodes, respectively;

a metal layer on said core layer over each of said at least one capacitor and comprised of a first portion including at least one metal strip, to be applied with one of a first potential and a second potential, and a second portion, electrically isolated from said at least one metal strip, respectively, to be applied with the other one of the first and second potentials, said at least one metal strip being dispersed such that each metal strip overlies both the first electrode of a distinct pair of electrodes and the second electrode of a succeeding pair of electrodes and effects a mutual electrical connection between them through the first and second vias associated therewith, respectively; and at least one wiring layer on said metal layer and having third vias to provide interlayer electrical connections including between the first and second electrodes, through said metal layer, and wirings or power terminals associated with said package assembly.

42. The computer system according to claim 41, wherein said at least one capacitor comprises one or more ceramic capacitors operatively coupled as bypass capacitors, respectively.

43. The computer system according to claim 41, wherein said package is a package on which at least a processor die is mounted thereon, and wherein said package includes one of a printed circuit board (PCB), an organic land grid array (OLGA), a flip chip pin grid array (FCPGA), and an interposer.

* * * * *